(12) United States Patent
Chou et al.

(10) Patent No.: US 9,418,901 B2
(45) Date of Patent: *Aug. 16, 2016

(54) SEMICONDUCTOR DEVICE CONTAINING HEMT AND MISFET AND METHOD OF FORMING THE SAME

(71) Applicant: Taiwan Semiconductor Manufacturing Company, Ltd., Hsin-Chu (TW)

(72) Inventors: Chung-Yen Chou, Hsin-Chu (TW); Sheng-De Liu, Zhongli (TW); Fu-Chih Yang, Fengshan (TW); Shih-Chang Liu, Alian Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/515,392

(22) Filed: Oct. 15, 2014

(65) Prior Publication Data

US 2015/0031176 A1 Jan. 29, 2015

Related U.S. Application Data

(63) Continuation of application No. 13/777,701, filed on Feb. 26, 2013, now Pat. No. 8,912,573.

(51) Int. Cl.
*H01L 29/66* (2006.01)
*H01L 21/8252* (2006.01)
(Continued)

(52) U.S. Cl.
CPC ........ *H01L 21/8252* (2013.01); *H01L 27/0605* (2013.01); *H01L 27/085* (2013.01); *H01L 29/66431* (2013.01); *H01L 29/66462* (2013.01); *H01L 29/66522* (2013.01); *H01L 29/778* (2013.01); *H01L 29/7786* (2013.01); *H01L29/1066* (2013.01); *H01L 29/2003* (2013.01); *H01L 29/517* (2013.01)

(58) Field of Classification Search
CPC .............. H01L 27/085; H01L 27/0605; H01L 29/7786; H01L 29/1066; H01L 29/517; H01L 29/2003
See application file for complete search history.

(56) References Cited

U.S. PATENT DOCUMENTS

2007/0131968 A1* 6/2007 Morita .............. H01L 21/28581 257/192
2008/0251837 A1* 10/2008 Kato ................... H01L 21/8252 257/324

(Continued)

FOREIGN PATENT DOCUMENTS

CN 101405868 A 4/2009
CN 102460710 A 5/2012

*Primary Examiner* — Jerome Jackson, Jr.
*Assistant Examiner* — Mohammed R Alam
(74) *Attorney, Agent, or Firm* — Slater Matsil, LLP

(57) ABSTRACT

A semiconductor structure with a MISFET and a HEMT region includes a first III-V compound layer. A second III-V compound layer is disposed on the first III-V compound layer and is different from the first III-V compound layer in composition. A third III-V compound layer is disposed on the second III-V compound layer is different from the second III-V compound layer in composition. A source feature and a drain feature are disposed in each of the MISFET and HEMT regions on the third III-V compound layer. A gate electrode is disposed over the second III-V compound layer between the source feature and the drain feature. A gate dielectric layer is disposed under the gate electrode in the MISFET region but above the top surface of the third III-V compound layer.

20 Claims, 5 Drawing Sheets

(51) Int. Cl.
*H01L 29/778* (2006.01)
*H01L 27/06* (2006.01)
*H01L 27/085* (2006.01)
*H01L 29/51* (2006.01)
*H01L 29/10* (2006.01)
*H01L 29/20* (2006.01)

(56) References Cited

U.S. PATENT DOCUMENTS

2009/0230432 A1  9/2009  Miyashita
2009/0250767 A1* 10/2009  Nomura .............. H01L 21/8252
                                                              257/392
2010/0289067 A1  11/2010  Mishra et al.
2012/0074577 A1*  3/2012  Nakanishi .......... H01L 29/0696
                                                              257/773
2013/0009165 A1   1/2013  Park et al.
2013/0062664 A1*  3/2013  Takeuchi ............ H01L 29/1066
                                                              257/190
2013/0146893 A1   6/2013  Thei et al.
2013/0341678 A1* 12/2013  Green ................ H01L 21/31111
                                                              257/192

* cited by examiner

US 9,418,901 B2

SEMICONDUCTOR DEVICE CONTAINING HEMT AND MISFET AND METHOD OF FORMING THE SAME

PRIORITY CLAIM AND CROSS-REFERENCE

The present application is a continuation of U.S. application Ser. No. 13/777,701, entitled "Semiconductor Device Containing HEMT and MISFET and Method of Forming the Same," filed on Feb. 26, 2013, which is incorporated herein by reference.

TECHNICAL FIELD

This disclosure relates generally to a semiconductor structure and, more particularly, to a joint high electron mobility transistor (HEMT) and metal-insulator-semiconductor field-effect transistor (MISFET) semiconductor structure, and method for forming this semiconductor structure.

BACKGROUND

In semiconductor technology, due to their characteristics, Group III-Group V (or III-V) semiconductor compounds are used to form various integrated circuit devices, such as high power field-effect transistors, high frequency transistors, or high electron mobility transistors (HEMTs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility, the ability to transmit signals at high frequencies, etc.

From an application point of view, enhancement-mode (E-mode) HEMTs have many advantages. E-mode HEMTs allow elimination of a negative-polarity voltage supply, and, therefore, reduction of the circuit complexity and cost. Despite the attractive properties noted above, a number of challenges exist in connection with developing III-V semiconductor compound-based devices. Various techniques directed at configurations and materials of these III-V semiconductor compounds have been implemented to try and further improve transistor device performance.

Frequently, layers of a semiconductor are doped in the manufacturing process. Magnesium (Mg) is a common dopant for a P-type gallium nitride (p-GaN). Mg diffuses into active layers and impacts performance, specifically in the 2-dimensional electron gas (2DEG) and current density of HEMT devices.

Therefore, the process for making semiconductor structures containing HEMT and MISFET devices need to be improved continuous to ensure high level performance and production yield.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

A plurality of semiconductor chip regions is marked on the substrate by scribe lines between the chip regions. The substrate will go through a variety of cleaning, layering, patterning, etching and doping steps to form integrated circuits. The term "substrate" herein generally refers to the bulk substrate on which various layers and device structures are formed. In some embodiments, the bulk substrate includes silicon or a compound semiconductor, such as GaAs, InP, SiGe, or SiC. Examples of such layers include dielectric layers, doped layers, polysilicon layers, diffusion barrier layers, or conductive layers. Examples of device structures include transistors, resistors, and/or capacitors, which may be interconnected through an interconnect layer to additional integrated circuits.

Figure 1:
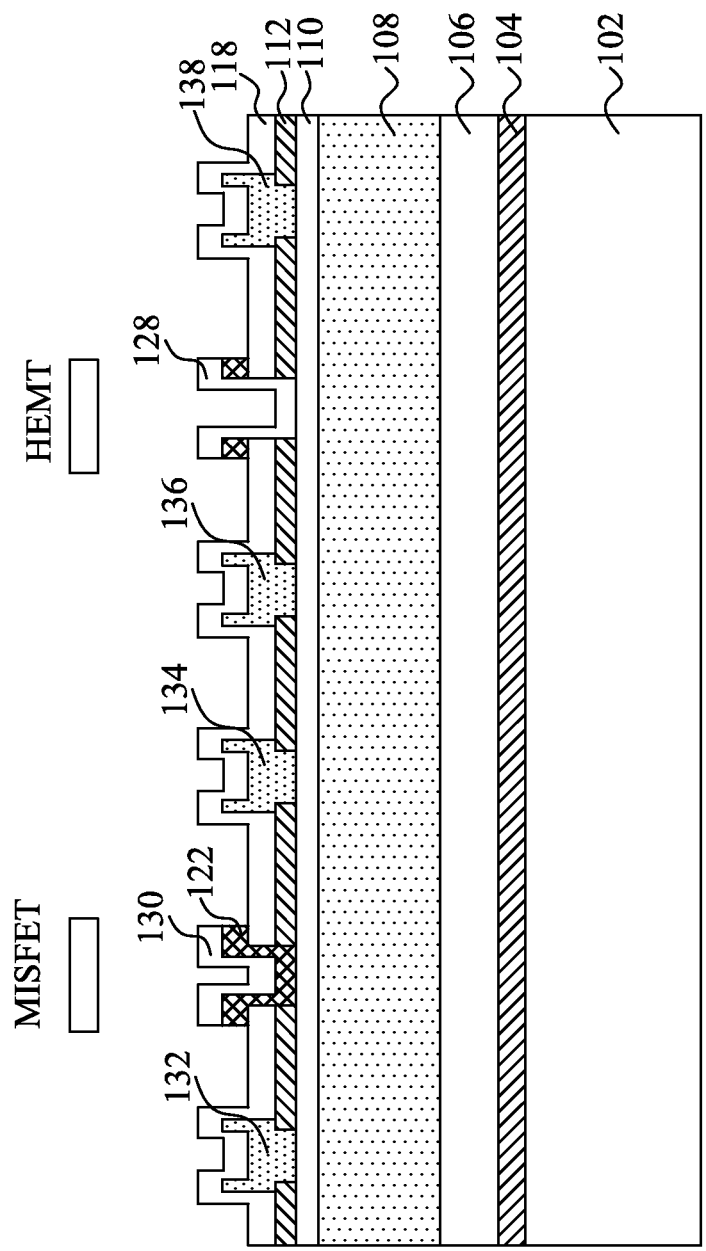
FIG. 1 is a cross-sectional view of a semiconductor structure having both a high electron mobility transistor (HEMT) and metal-insulator-semiconductor field-effect transistor (MISFET) regions, according to one or more embodiments of this disclosure.

FIG. 1 is a cross-sectional view of a semiconductor structure 100 having both a high electron mobility transistor (HEMT) and metal-insulator-semiconductor field-effect transistor (MISFET) according to one or more embodiments of this disclosure.

Referring to FIG. 1, the semiconductor structure 100 having both a HEMT and a MISFET is illustrated. The semiconductor structure 100 includes a substrate 102. In some embodiments, the substrate 102 includes a silicon carbide (SiC) substrate, sapphire substrate or a silicon substrate.

The semiconductor structure 100 also includes a heterojunction formed between two different semiconductor material layers, such as material layers with different band gaps. For example, the semiconductor structure 100 includes a non-doped narrow-band gap channel layer and a wide-band gap n-type donor-supply layer. In at least one embodiment, the semiconductor structure 100 includes a first III-V compound layer (or referred to as a buffer layer) 104 formed on the substrate 102 and a second III-V compound layer (or referred to as a donor-supply layer) 106 formed on the channel layer 104. The channel layer 104 and the donor-supply layer 106 are compounds made from the III-V groups in the periodic table of elements. However, the channel layer 104 and the donor-supply layer 106 are different from each other in composition. The channel layer 104 is undoped or unintentionally doped (UID). In the present example of the semiconductor structure 100, the channel layer 104 includes a gallium nitride (GaN) layer (also referred to as the GaN layer 104). The donor-supply layer 106 includes an aluminum gallium nitride (AlGaN) layer (also referred to as AlGaN layer 106). The GaN layer 104 and AlGaN layer 106 directly contact each other. In another example, the channel layer 104 includes a GaAs layer or InP layer. The donor-supply layer 106 includes an AlGaAs layer or an AlInP layer.

The GaN layer 104 is undoped. Alternatively, the GaN layer 104 is unintentionally doped, such as lightly doped with n-type dopants due to a precursor used to form the GaN layer 104. In one example, the GaN layer 104 has a thickness in a range from about 0.5 microns to about 10 microns.

The AlGaN layer 106 is intentionally doped. In one example, the AlGaN layer 106 has a thickness in a range from about 5 nanometers (nm) to about 50 nm.

The semiconductor structure 100 also includes at least two sets of source features and drain features (132/134 and 136/138, respectively disposed on the AlGaN layer 110. Each of the source feature and the drain feature comprises a metal feature. In one example, the metal feature is free of Au and comprises Al, Ti, or Cu. Each set of these source features is placed in a respective MISFET or HEMT region of the semiconductor structure 100.

The semiconductor structure 100 further includes a dielectric cap layer 112 disposed on a top surface of the AlGaN layer 110 not occupied by the metal features. In the MISFET region of the semiconductor structure 110, the dielectric cap layer 112 fills an opening that exposes a portion of the AlGaN layer 110 for a gate electrode formation. The dielectric cap layer 112 protects the underlying AlGaN layer 110 from damage in the following process having plasma.

In some embodiments, the semiconductor structure 100 further includes a protection layer 118. The protection layer is disposed on top surfaces of the metal features (132/134 and 136/138) and under the gate dielectric layer 122. The protection layer further includes an opening that aligns with the opening in the dielectric cap layer 112. The combined opening of the opening in the protection layer and the opening in the dielectric cap layer 112 exposes the portion of the AlGaN layer 110 for the gate electrode formation. The protection layer also covers the source feature and the drain feature, and prevents the source feature and the drain feature from exposure during an annealing process in the formation of the isolation regions 116.

On the MISFET side of the semiconductor structure 100, it also includes a gate electrode 130 disposed on the opening over AlGaN layer 110 between the source and drain features. The gate electrode 130 includes a conductive material layer configured for voltage bias and electrical coupling with the carrier channel. In this embodiment, the conductive material is disposed on top of a gate dielectric layer 122. In various examples, the conductive material layer includes a refractory metal or its compounds, e.g., titanium (Ti), titanium nitride (TiN), titanium tungsten (TiW) and tungsten (W). In another example, the conductive material layer includes nickel (Ni), gold (Au) or copper (Cu).

On the HEMT side of the semiconductor structure 100, it includes a gate electrode 128 disposed on the opening over AlGaN layer 110 between the source and drain features. Here, since there is no gate dielectric layer 122 disposed in the opening above AlGaN layer 110, the gate electrode 128 is in direct contact with the AlGaN layer 110. The gate electrode 128 also includes a conductive material layer configured for voltage bias and electrical coupling with the carrier channel. In various examples, the conductive material layer includes a refractory metal or its compounds, e.g., titanium (Ti), titanium nitride (TiN), titanium tungsten (TiW) and tungsten (W). In another example, the conductive material layer includes nickel (Ni), gold (Au) or copper (Cu).

In the above described embodiments, the gate electrode 128 and 130, the source/drain features, and the carrier channel in the GaN layer 106 are configured as a transistor. When a voltage is applied to the gate stack, a device current of the transistor could be modulated.

Figure 2:
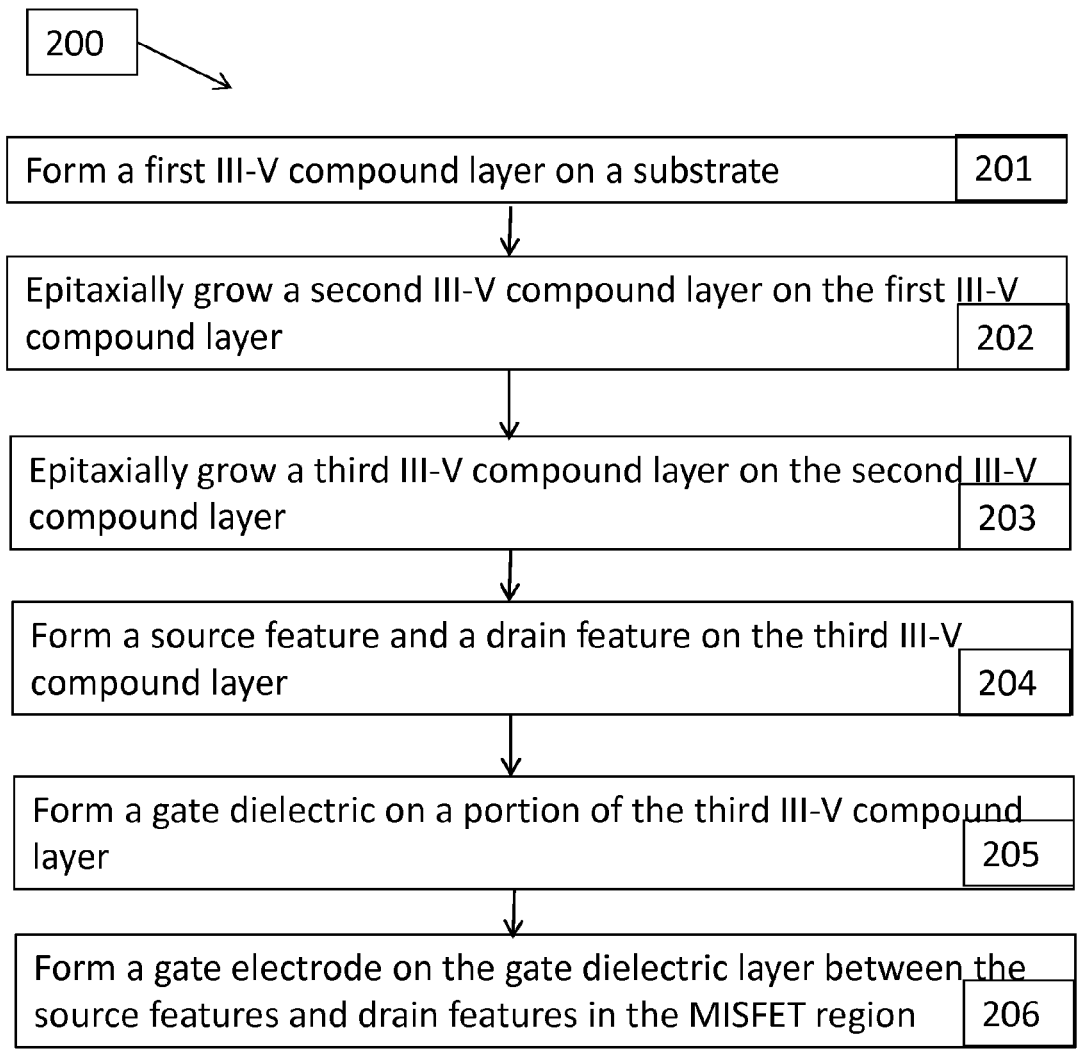
FIG. 2 is a flowchart of a method of forming a semiconductor structure having both a HEMT and a MISFET according to one or more embodiments of this disclosure.

FIG. 2 is a flowchart of a method 200 of forming a semiconductor structure having a HEMT and a MISFET according to one or more embodiments of this disclosure. Referring now to FIG. 2, the flowchart of the method 200, at operation 201, a first III-V compound layer is provided. The first III-V compound layer is formed on a substrate. Next, the method 200 continues with operation 202 in which a second III-V compound layer is epitaxially grown on the first III-V compound layer. The method 200 continues with operation 203 in which a third III-V compound layer is epitaxially grown on the second III-V compound layer. The method 200 continues with operation 204 in which a source feature and a drain feature are formed on the third III-V compound layer. The method 200 continues with operation 205 in which a gate dielectric layer is deposited on a portion of the third III-V compound layer. The method 200 continues with operation 206 in which a gate electrode is formed on the gate dielectric layer between the source feature and the drain feature in the MISFET region of the semiconductor structure. It should be noted that additional processes may be provided before, during, or after the method 200 of FIG. 2.

FIGS. 3 to 10 are cross-sectional views of the semiconductor structure 100 having both HEMT and MISFET structures at various stages of manufacture according to various embodiments of the method 200 of FIG. 2. Various figures have been simplified for a better understanding of the inventive concepts of the present disclosure.

Figure 3:
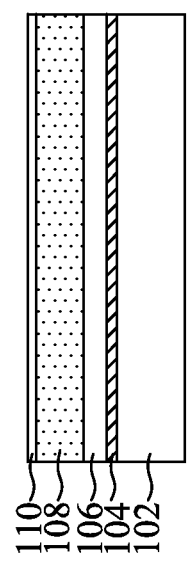

Referring to FIG. 3, which is an enlarged cross-sectional view of a portion of a substrate 102 of a semiconductor structure 100 after performing operations 201, 202 and 203. In some embodiments, the substrate 102 includes a silicon carbide (SiC) substrate, sapphire substrate or a silicon substrate. A first III-V compound layer 104, also referred to as a buffer layer, is grown on the substrate 102. In the embodiment of FIGS. 3-10, the first III-V compound layer 104 refers to a gallium nitride (GaN) layer (also referred to as the GaN layer 104). The GaN layer 104 can be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiary-butylamine (TBAm), phenyl hydrazine, or other suitable chemical. In the embodiment of FIGS. 3-10, the GaN layer 104 has a thickness in a range from about 0.5 micron to about 10 microns. In other embodiments, the first III-V compound layer 104 may include a GaAs layer or AlN layer.

A second III-V compound layer 106, also referred to as donor-supply layer, is grown on first III-V compound layer (i.e., the buffer layer) 104. In at least one embodiment, the second III-V compound layer 106 refers to an aluminum gallium nitride (AlGaN) layer (also referred to as the AlGaN layer 106). In the embodiment of FIGS. 3-10, the AlGaN layer 106 is epitaxially grown on the AlN buffer layer 104 by MOVPE using aluminum-containing precursor, gallium-containing precursor, and nitrogen-containing precursor. The aluminum-containing precursor includes trimethylaluminum (TMA), triethylaluminium (TEA), or other suitable chemical. The gallium-containing precursor includes TMG, TEG, or other suitable chemical. The nitrogen-containing precursor includes ammonia, TBAm, phenyl hydrazine, or other suitable chemical. In the embodiment of FIGS. 3-10, the AlGaN layer 106 has a thickness in a range from about 5 nanometers to about 50 nanometers. In other embodiments, the second III-V compound layer 106 may include an AlGaAs layer, or AlInP layer.

Further, the second III-V compound layer 106 may include an InGaN diffusion barrier layer. The InGaN diffusion barrier layer may be grown at a range of about 300 mbar to about 500 mbar and in a range of about 700° C. to about 900° C. The Indium composition of the InGaN diffusion barrier layer 130 may be in a range from about 5% to about 10%.

Thereafter, a P-type GaN layer 108 is disposed onto the second III-N compound layer 106. Then, a second AlGaN layer 110 is disposed onto the P-type GaN layer 108.

Figure 4:
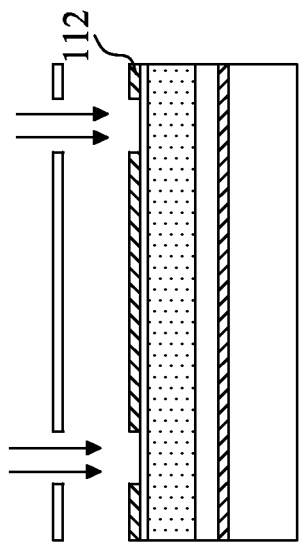
FIGS. 3 to 11 are cross-sectional views of a semiconductor structure having a HEMT at various stages of manufacture according to one embodiment of the method of FIG. 2.

Next, a dielectric cap layer 112 is deposited on a top surface of the second AlGaN layer 110, and over the top surface of the P-type GaN 108 (as shown in FIG. 4). In the embodiment of FIGS. 3-10, the dielectric cap layer 112 has a thickness in a range from about 100 Å to about 5000 Å. In some embodiments, the dielectric cap layer 112 includes $SiO_2$ or $Si_3N_4$. In one example, the dielectric cap layer 112 is $Si_3N_4$ and is formed by performing a low pressure chemical vapor deposition (LPCVD) method without plasma using $SiH_4$ and $NH_3$ gases. An operation temperature is in a range of from about 650° C. to about 800° C. An operation pressure is in a range of about 0.1 Torr and about 1 Torr. The dielectric cap layer 112 protects the underlying second AlGaN layer 110 from damage in the following processes having plasma. Next, as FIG. 4 shows, two openings in the dielectric cap layer 112 are defined by lithography and etching processes to expose two openings in the second AlGaN, III-V compound, layer 110.

Figure 5:
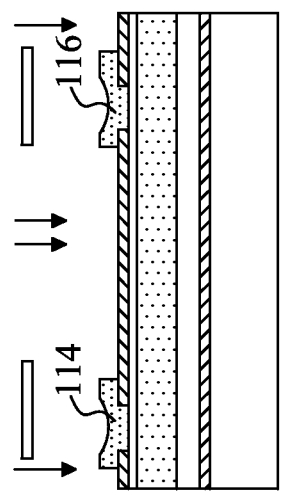

Next, as shown in FIG. 5, a metal layer is deposited over the dielectric cap layer 112, which overfills the two openings and contacts the second AlGaN III-V compound layer 110. A photoresist layer (not shown) is formed over the metal layer and developed to form a feature over each of the two openings. The metal layer not covered by the feature of the photoresist layer is removed by a reactive ion etch (RIE) process that etches the exposed portions of the metal layer down to the underlying the dielectric cap layer 112. Two metal features 114 and 116 are generated after the etching process. The metal features 114 and 116 are configured as the source feature or the drain feature for the MISFET and the HEMT, respectively. The photoresist layer is removed after the formation of the metal features 114 and 116. The dielectric cap layer 112 protects the underlying second AlGaN III-V compound layer 110 from damage during the etching process to form metal features 114 and 116.

In some embodiments, the metal layer of the metal features 114 and 116 includes one or more conductive materials. In at least one example, the metal layer is free of gold (Au) and comprises titanium (Ti), titanium nitride (TiN), or aluminum copper (AlCu) alloy. In another example, the metal layer includes a bottom Ti/TiN layer, an AlCu layer overlying the bottom Ti/TiN layer, and a top Ti layer overlying the AlCu layer. The formation methods of the metal layer include atomic layer deposition (ALD) or physical vapor deposition (PVD) processes. Without using Au in the metal features 114 and 116, the method 200 could also be implemented in the production line of integrated circuits on silicon substrate. The contamination concern from Au on the silicon fabrication process could be eliminated.

Figure 6:
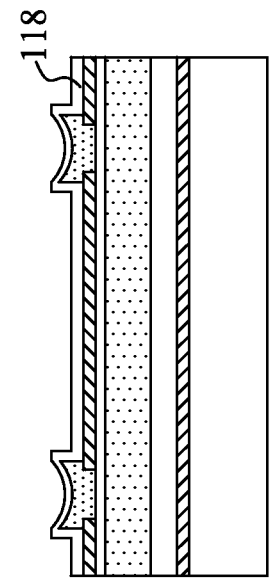

Next, as FIG. 6 shows a protection layer 118 is optionally deposited on top surfaces of the metal features 114 and 116 and the dielectric cap layer 112. In some embodiments, the protection layer includes dielectric materials such as $SiO_2$ or $Si_3N_4$. In one example, the protection layer is $Si_3N_4$ and is formed by performing a plasma enhanced chemical vapor deposition (PECVD) method.

Figure 7:
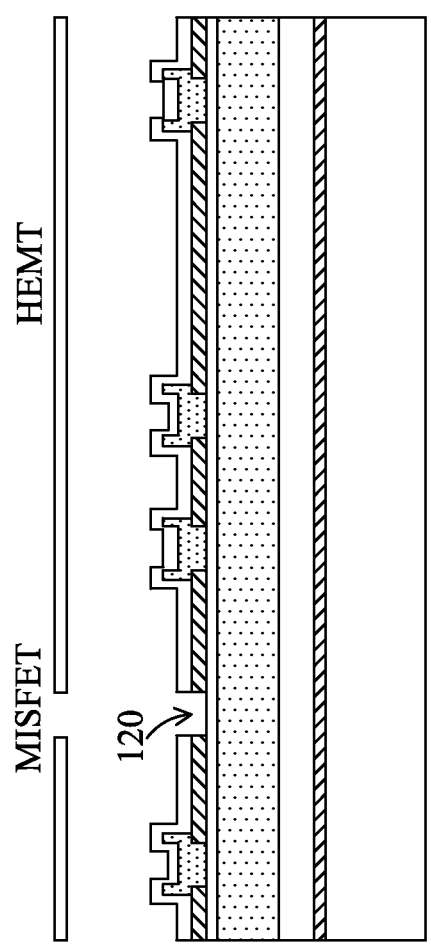

FIG. 7 illustrates the structure 100 after forming an opening 120 in the dielectric cap layer 112 (also in the protection layer 118). Specifically, a patterned mask layer (not shown) is formed on a top surface of the dielectric cap layer 112 and an etching process is performed to remove a portion of the dielectric cap layer 112 (also remove a portion of the protection layer if the protection layer exists). The opening 120 exposes a portion of the top surface of the second AlGaN III-V compound layer 110. The opening 116 is configured as a location for the later gate electrode formation. It is important to note that, in this embodiment, the opening 120 is formed in the MISFET region of the semiconductor structure, while the HEMT region of the semiconductor structure is covered by a patterned mask.

Figure 8:
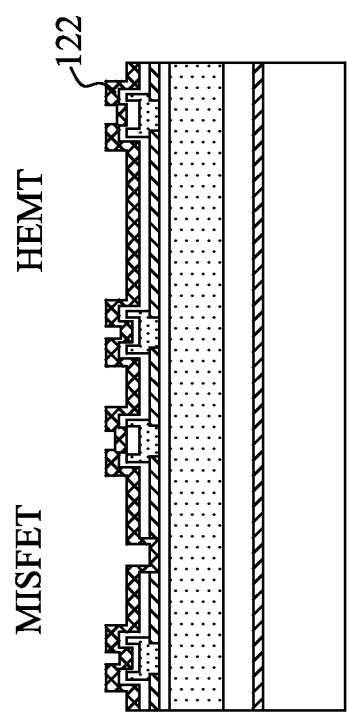

FIG. 8 illustrates the structure 100 after depositing a gate dielectric layer 122 in operation 204. The gate dielectric layer 122 is deposited on the dielectric cap layer 112, along an interior surface of the opening 120 and on the exposed portion of the second AlGaN III-V compound layer 110 in the MISFET region. The gate dielectric layer 122 is also deposited over the source feature and the drain feature. In some embodiments, the gate dielectric layer 122 is in a thickness range from about 3 nm to about 20 nm. In some examples, the gate dielectric layer 122 comprises silicon oxide, silicon nitride, gallium oxide, aluminum oxide, scandium oxide, zirconium oxide, lanthanum oxide or hafnium oxide. In one embodiment, the gate dielectric layer 122 is formed by an atomic layer deposition (ALD) method. The ALD method is based on the sequential use of a gas phase chemical process. The majority of ALD reactions use two chemicals, typically called precursors. These precursors react with a surface one-at-a-time in a sequential manner. By exposing the precursors to the growth surface repeatedly, the gate dielectric layer 122 is deposited. The ALD method provides a uniform thickness of the gate dielectric layer 122 with high quality. In one example, the gate dielectric layer 118 is zirconium oxide. In some embodiments, a first precursor includes tetrakis[ethylmethylamino]zirconium (TEMAZr) or zirconium chloride ($ZrCl_4$). In some embodiments, a second precursor includes oxygen in order to oxidize the first precursor material to form a monolayer. In some examples, the second precursor includes ozone ($O_3$), oxygen, water ($H_2O$), $N_2O$ or $H_2O$—$H_2O_2$. In other embodiments, the gate dielectric layer 122 is formed by a plasma enhanced chemical vapor deposition (PECVD) or a low pressure chemical vapor deposition (LPCVD).

Figure 9:
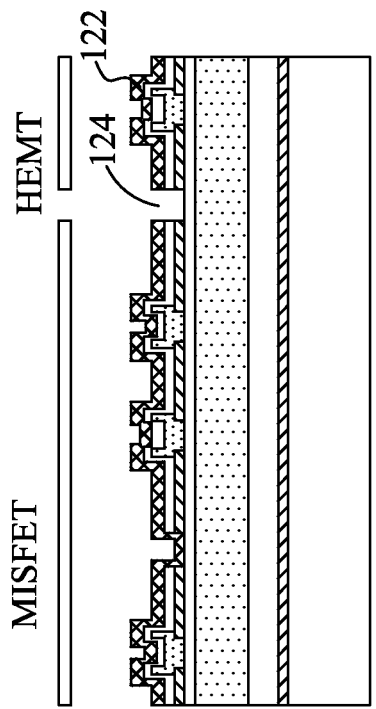

Next, as FIG. 9 illustrates, an opening 124 is formed in the HEMT region of the dielectric cap layer 112 (also in the protection layer 118). Note that opening 124 in the HEMT region of the semiconductor structure is formed while the HEMT region is covered by a mask. A patterned mask layer (not shown) is formed on a top surface of the dielectric cap layer 112 in the HEMT region, and an etching process is performed to remove a portion of the dielectric cap layer 112 (also remove a portion of the protection layer 118). The opening 124, therefore, exposes a portion of the top surface of the second AlGaN III-V compound layer 110 in the HEMT region. The opening 122 is configured as a location for the later gate electrode formation in the HEMT region. In essence, the embodiment requires forming HEMT and MISFET gates separately.

Figure 10:
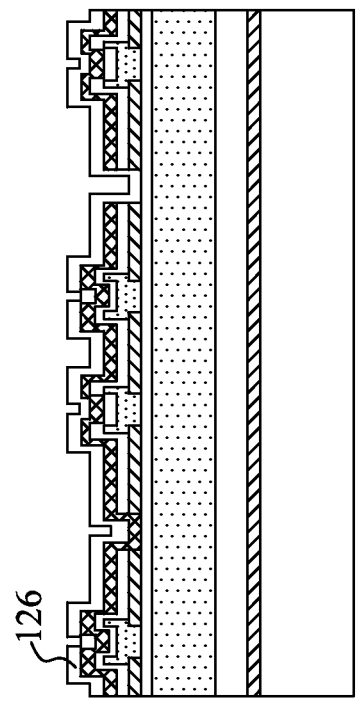

FIG. 10 illustrates the structure 100 after performing operation 206, which forms a conductive material layer 126 over the entire MISFET and HEMT regions. In various examples, the conductive material layer 126 includes a refractory metal or its compounds, e.g., titanium (Ti), titanium nitride (TiN), titanium tungsten (TiW) and tungsten (W). In another example, the conductive material layer 126 includes nickel (Ni), gold (Au) or copper (Cu). The conductive material layer 126 overfills the opening 124 in the HEMT region. The conductive material lies on top of the portion of the dielectric cap layer 112, which had filled the opening 120 in the MISFET region.

Figure 11:
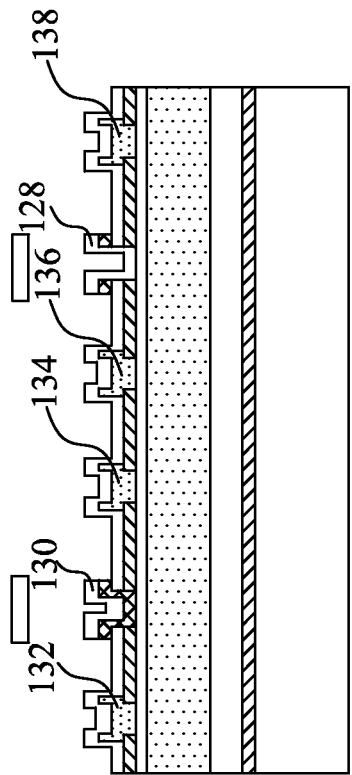

Next, as FIG. 11 shows, gate electrodes 128 and 130 are formed above portions of the second AlGaN III-V compound layer 110. Lithography and etching processes are performed on the gate electrode layer to define the gate electrodes 128 and 130 in the HEMT and MISFET regions, respectively. Specifically, in this step of the process, the conductive material layer and the underlying dielectric layer 122 are removed across both the MISFET and HEMT regions in the semiconductor structure. Thereafter, each of the gate electrodes 128 and 130 is formed between the source and drain features of the respective HEMT and MISFET regions. In some embodiments, the gate electrode 128 includes a conductive material layer that includes a refractory metal or its compounds, e.g., titanium (Ti), titanium nitride (TiN), titanium tungsten (TiW) and tungsten (W). In another example, the gate electrodes 128 and 130 includes nickel (Ni), gold (Au) or copper (Cu).

Various embodiments of the present disclosure may be used to improve the performance of a semiconductor structure having a HEMT and MISFET. For example, in conventional process methods for making semiconductor structures containing HEMT and MISFET, after dielectric layer is deposited onto the structure, it is removed alternately in the MISFET and HEMT regions. In contrast, in the embodiments of this invention, the dielectric layer is removed simultaneously across both the HEMT and MISFET regions.

According to an embodiment, a method comprises forming a stack of semiconductor layers over a substrate, each semiconductor layer in the stack of semiconductor layers having a different band gap than an adjacent semiconductor layer in the stack of semiconductor layers, and forming a capping layer over the stack of semiconductor layers, the capping layer comprising a first source opening, a first drain opening, a second source opening, and a second drain opening. The method further comprises simultaneously forming first and second source and drain features in the respective first and second source and drain openings, forming a first gate opening between the first source feature and the first drain feature, and forming a gate dielectric layer in the first gate opening. The method further comprises forming a second gate opening between the second source feature and the second drain feature, and simultaneously forming a gate electrode layer in the first gate opening and the second gate opening.

According to another embodiment, a method comprises forming a stack of semiconductor layers over a substrate, each semiconductor layer in the stack of semiconductor layers having a different band gap than an adjacent semiconductor layer in the stack of semiconductor layers, and forming a capping layer over the stack of semiconductor layers, the capping layer including a first source opening, a first drain opening, a second source opening, and a second drain opening. The method further comprises simultaneously forming first and second source and drain features in the respective first and second source and drain openings, and forming a protection layer over the capping layer, the protection layer including a first gate opening and a second gate opening, wherein the first gate opening and the second gate opening extend through the capping layer. The method further comprises forming a gate dielectric material in the first gate opening, and forming a gate electrode layer in the first gate opening and the second gate opening.

According to yet another embodiment, a method comprises epitaxially growing a second III-V compound layer over a first III-V compound layer, the second III-V compound layer having a different band gap than the first III-V compound layer, epitaxially growing a third III-V compound layer over the second III-V compound layer, and forming a dielectric layer over the third III-V compound layer, the dielectric layer including a first source opening, a first drain opening, a second source opening, and a second drain opening. The method further comprises simultaneously forming first and second source and drain features in the respective first and second source and drain openings, and forming a protection layer over the dielectric layer, the protection layer including a first gate opening between the first source feature and first drain feature and a second gate opening between the second source feature and the second drain feature. The method further comprises forming a gate dielectric layer in the first gate opening, and simultaneously forming a first gate electrode in the first gate opening and a second gate electrode in the second gate opening, wherein the gate dielectric is interposed between the first gate electrode and the third III-V compound layer, and wherein the second gate electrode contacts the third III-V compound layer.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a stack of semiconductor layers over a substrate, each semiconductor layer in the stack of semiconductor layers having a different band gap than an adjacent semiconductor layer in the stack of semiconductor layers;
   forming a capping layer over the stack of semiconductor layers, the capping layer comprising a first source opening, a first drain opening, a second source opening, and a second drain opening;
   simultaneously forming first and second source and drain features in the respective first and second source and drain openings;
   forming a first gate opening in the capping layer between the first source feature and the first drain feature;
   forming a gate dielectric layer in the first gate opening;
   after forming the gate dielectric layer, forming a second gate opening in the capping layer between the second source feature and the second drain feature; and
   simultaneously forming a gate electrode layer in the first gate opening and the second gate opening.

2. The method of claim 1, wherein the forming the stack of semiconductor layers comprises:
   forming a first III-V compound layer on the substrate;
   forming a second III-V compound layer on the first III-V compound layer;
   forming a third III-V compound layer over the second III-V compound layer; and
   forming a fourth III-V compound layer over the third III-V compound layer.

3. The method of claim 2, wherein the first III-V compound layer is formed of GaN, the second III-V compound layer is formed of AlGaN, the third III-V compound layer is formed of p-type GaN, and the fourth III-V compound layer is formed of AlGaN.

4. The method of claim 2, wherein the second III-V compound layer further comprises InGaN, with an indium (In) composition between about 5% and about 10%.

5. The method of claim 1, wherein the forming the first source opening, the first drain opening, the second source opening, and the second drain opening further exposes a topmost semiconductor layer in the stack of semiconductor layers.

6. The method of claim 1, further comprises forming a protection layer over the capping layer, wherein the first gate opening and the second gate opening extend through the protection layer.

7. The method of claim 6, wherein at least a portion of the gate dielectric layer is interposed between the protection layer and the gate electrode layer.

8. The method of claim 6, wherein at least a portion of the protection layer is interposed between the capping layer and the gate dielectric layer.

9. A method comprising:
   forming a stack of semiconductor layers over a substrate, each semiconductor layer in the stack of semiconductor layers having a different band gap than an adjacent semiconductor layer in the stack of semiconductor layers;
   forming a capping layer over the stack of semiconductor layers, the capping layer including a first source opening, a first drain opening, a second source opening, and a second drain opening;
   simultaneously forming first and second source and drain features in the respective first and second source and drain openings;
   forming a protection layer over the capping layer, the protection layer including a first gate opening and a second gate opening, wherein the first gate opening and the second gate opening extend through the capping layer;
   forming a gate dielectric material in the first gate opening, the second gate opening being free of the gate dielectric material after forming the gate dielectric material in the first gate opening; and
   forming a gate electrode layer in the first gate opening and the second gate opening.

10. The method of claim 9, wherein the forming the stack of semiconductor layers includes:
   epitaxially growing a GaN layer on the substrate;
   epitaxially growing a first AlGaN layer on the GaN layer;
   epitaxially growing a p-type GaN layer on the first AlGaN layer; and
   epitaxially growing a second AlGaN layer on the p-type GaN layer.

11. The method of claim 10, wherein the GaN layer has a thickness between about 0.5 μm and about 10 μm, the first AlGaN layer has a thickness between about 5 nm and about 50 nm.

12. The method of claim 9, further comprising patterning the gate electrode layer to simultaneously form a first gate electrode and a second gate electrode, wherein first gate electrode is formed in the first gate opening, and wherein the second gate electrode is formed in the second gate opening.

13. The method of claim 12, wherein the first gate electrode, first source feature, and first drain feature form a metal-insulator-semiconductor field-effect transistor (MISFET), and wherein the second gate electrode, second source feature, and second drain feature form a high electron mobility transistor (HEMT).

14. The method of claim 12, wherein the second gate electrode contacts a topmost semiconductor layer in the stack of semiconductor layers.

15. A method comprising:
   epitaxially growing a second III-V compound layer over a first III-V compound layer, the second III-V compound layer having a different band gap than the first III-V compound layer;
   epitaxially growing a third III-V compound layer over the second III-V compound layer;
   forming a dielectric layer over the third III-V compound layer, the dielectric layer including a first source opening, a first drain opening, a second source opening, and a second drain opening;
   simultaneously forming first and second source and drain features in the respective first and second source and drain openings;
   forming a protection layer over the dielectric layer, the protection layer including a first gate opening between the first source feature and first drain feature and a second gate opening between the second source feature and the second drain feature;
   forming a gate dielectric layer in the first gate opening; and
   simultaneously forming a first gate electrode in the first gate opening and a second gate electrode in the second gate opening, wherein the gate dielectric layer is interposed between the first gate electrode and the third III-V compound layer, and wherein the second gate electrode contacts the third III-V compound layer.

16. The method of claim 15, wherein the forming the dielectric layer comprises depositing a silicon oxide or silicon nitride layer.

17. The method of claim 15, wherein the forming the protection layer comprises depositing a silicon oxide or silicon nitride layer.

18. The method of claim 15, wherein the dielectric layer has a thickness between about 100 Å and about 5000 Å.

19. The method of claim 15, wherein at least a portion of the gate dielectric layer is interposed between the protection layer and the second gate electrode.

20. The method of claim 15, wherein the protection layer overlays the first and second source and drain features.

* * * * *